US012794442B2

(12) United States Patent
Yamamoto et al.

(10) Patent No.: US 12,794,442 B2
(45) Date of Patent: Nov. 10, 2026

(54) COMPOSITE SUBSTRATE, SURFACE ACOUSTIC WAVE ELEMENT, AND METHOD FOR MANUFACTURING COMPOSITE SUBSTRATE

(71) Applicant: NGK INSULATORS, LTD., Nagoya (JP)

(72) Inventors: Takeshi Yamamoto, Nagoya (JP); Naoki Fujita, Nagoya (JP); Keiichiro Asai, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 18/805,704

(22) Filed: Aug. 15, 2024

(65) Prior Publication Data

US 2024/0405743 A1 Dec. 5, 2024

Related U.S. Application Data

(63) Continuation of application No. PCT/JP2023/007233, filed on Feb. 28, 2023.

(30) Foreign Application Priority Data

Mar. 28, 2022 (JP) ................................ 2022-052001

(51) Int. Cl.
*H03H 9/02* (2006.01)
*H03H 3/08* (2006.01)

(52) U.S. Cl.
CPC .......... *H03H 9/02574* (2013.01); *H03H 3/08* (2013.01); *H03H 9/02559* (2013.01)

(58) Field of Classification Search
CPC .. H03H 9/02574; H03H 3/08; H03H 9/02559; H03H 2003/025; H03H 9/175; H03H 9/25; H03H 9/02637
See application file for complete search history.

(56) References Cited

U.S. PATENT DOCUMENTS

| | | | |
|---|---|---|---|
| 6,603,241 | B1 | 8/2003 | Barber et al. |
| 10,193,524 | B2 | 1/2019 | Morton et al. |
| 11,146,237 | B2 | 10/2021 | Nagatomo |

(Continued)

FOREIGN PATENT DOCUMENTS

| | | | | |
|---|---|---|---|---|
| EP | 1158671 A2 * | 11/2001 | ............. H03H 9/175 |
| JP | 2002-041052 A | 2/2002 | |

(Continued)

OTHER PUBLICATIONS

English translation of the International Preliminary Report on Patentability (Chapter I) dated Oct. 10, 2024 (Application No. PCT/JP2023/007233).

(Continued)

*Primary Examiner* — Andrea Lindgren Baltzell
*Assistant Examiner* — Kimberly E Glenn
(74) *Attorney, Agent, or Firm* — Muncy, Geissler, Olds & Lowe, P.C.

(57) ABSTRACT

A composite substrate includes in this order: a piezoelectric layer; a reflective layer including a low-impedance layer containing silicon oxide and a high-impedance layer; and a support substrate. The low-impedance layer has a density of 2.4 g/cm$^3$ or less. The high-impedance layer has formed therein an amorphous region.

10 Claims, 3 Drawing Sheets

(56) References Cited

U.S. PATENT DOCUMENTS

| | | | |
|---|---|---|---|
| 2017/0117872 | A1 | 4/2017 | Morton et al. |
| 2020/0228092 | A1 | 7/2020 | Nagatomo |
| 2022/0014172 | A1 | 1/2022 | Nozoe |
| 2023/0006634 | A1 | 1/2023 | Yamamoto et al. |
| 2023/0198495 | A1 | 6/2023 | Ouchi |

FOREIGN PATENT DOCUMENTS

| | | | | | |
|---|---|---|---|---|---|
| JP | 2006-109129 | A | | 4/2006 | |
| JP | 2008-211396 | A | | 9/2008 | |
| JP | 2014-086400 | A | | 5/2014 | |
| JP | 2018-535595 | A | | 11/2018 | |
| JP | 2020-061684 | A | | 4/2020 | |
| JP | 2020-113954 | A | | 7/2020 | |
| JP | 2020-150488 | A | | 9/2020 | |
| JP | 6935573 | B1 | | 9/2021 | |
| WO | 2020/100949 | A1 | | 5/2020 | |
| WO | WO-2020189115 | A1 | * | 9/2020 | ......... H03H 9/02574 |
| WO | 2022/044869 | A1 | | 3/2022 | |

OTHER PUBLICATIONS

Japanese Patent Publication No. 2020-150488 A (Ref. AH) is discussed at paragraph [0002] of the present specification.

Japanese Patent Publication No. 2014-086400 A (Ref. AI) is discussed at paragraph [0047] of the present specification.

Japanese Patent Publication No. 2002-041052 A (Ref. AL) corresponds to U.S. Pat. No. 6,603,241 B1 (Ref. AA).

Japanese Patent Publication No. 2020-113954 A (Ref. AM) corresponds to U.S. Patent Application Publication No. 2020/0228092 A1 (Ref. AB) which issued as U.S. Pat. No. 11,146,237 B2 (Ref. AC).

Japanese Patent Publication No. 2018-535595 A (Ref. AN) corresponds to U.S. Patent Application Publication No. 2017/0117872 A1 (Ref. AD) which issued as U.S. Pat. No. 10,193,524 B2 (Ref. AE).

International Publication No. WO 2020/100949 A1 (Ref. AO) corresponds to U.S. Patent Application Publication No. 2022/0014172 A1 (Ref. AF); and.

International Publication No. WO 2022/044869 A1 (Ref. AP) corresponds to U.S. Patent Application Publication No. 2023/0198495 A1 (Ref. AG).

International Search Report and Written Opinion (Application No. PCT/JP2023/007233) dated May 23, 2023 (11 pages).

Japanese Office Action for Japanese Application No. 2025-129889 dated Sep. 1, 2026.

* cited by examiner

COMPOSITE SUBSTRATE, SURFACE ACOUSTIC WAVE ELEMENT, AND METHOD FOR MANUFACTURING COMPOSITE SUBSTRATE

CROSS-REFERENCE TO RELATED APPLICATIONS

This application is a continuation under 35 U.S.C. 120 of International Application PCT/JP2023/007233 having the International Filing Date of Feb. 28, 2023, and having the benefit of the earlier filing date of Japanese Application No. 2022-052001, filed on Mar. 28, 2022. Each of the identified applications is fully incorporated herein by reference.

BACKGROUND OF THE INVENTION

Technical Field

The present invention relates to a composite substrate, a surface acoustic wave element, and a method of producing a composite substrate.

Background Art

For example, a filter utilizing a surface acoustic wave (SAW filter) has been used in a communication device such as a cellular phone for extracting an electric signal having any appropriate frequency. The SAW filter has a structure in which an electrode or the like is formed on a composite substrate having a piezoelectric layer (see, for example, Patent Literature 1).

Incidentally, in recent years, in the field of an information communication device, the device has been required to support communication in a high-frequency band. In the SAW filter, the leakage of an elastic wave from the piezoelectric layer may occur. Meanwhile, the composite substrate has been required to have durability (specifically, joining strength).

CITATION LIST

Patent Literature

[PTL 1] JP 2020-150488 A

SUMMARY OF THE INVENTION

A primary object of the present invention is to provide a composite substrate that is excellent in durability while confining the energy of an elastic wave in its piezoelectric layer.

1. According to one embodiment of the present invention, there is provided a composite substrate, including in this order: a piezoelectric layer; a reflective layer including a low-impedance layer containing silicon oxide and a high-impedance layer; and a support substrate, wherein the low-impedance layer has a density of 2.4 g/cm$^3$ or less, and wherein the high-impedance layer has formed therein an amorphous region.

2. In the composite substrate according to the above-mentioned item 1, the amorphous region may be formed in an end portion of the high-impedance layer in a thickness direction.

3. In the composite substrate according to the above-mentioned item 2, the amorphous region may be formed on a piezoelectric layer side of the high-impedance layer.

4. In the composite substrate according to any one of the above-mentioned items 1 to 3, the reflective layer may include a plurality of high-impedance layers, and the amorphous region may be formed in at least the high-impedance layer arranged closest to the support substrate.

5. In the composite substrate according to any one of the above-mentioned items 1 to 4, the high-impedance layer and the low-impedance layer may be alternately laminated in the reflective layer.

6. In the composite substrate according to any one of the above-mentioned items 1 to 5, the reflective layer and the support substrate may be arranged adjacent to each other.

7. In the composite substrate according to any one of the above-mentioned items 1 to 6, the high-impedance layer may contain at least one selected from the group consisting of: hafnium oxide; tantalum oxide; zirconium oxide; and aluminum oxide.

8. In the composite substrate according to any one of the above-mentioned items 1 to 7, the high-impedance layer and the low-impedance layer may each have a thickness of from 0.01 μm to 1 μm.

9. In the composite substrate according to the above-mentioned items 1 to 8, the amorphous region may have an average thickness of 10 nm or more.

10. According to another embodiment of the present invention, there is provided a surface acoustic wave element, including the composite substrate of any one of the above-mentioned items 1 to 9.

11. According to another aspect of the present invention, there is provided a method of producing a composite substrate. The method of producing a composite substrate includes: forming a low-impedance layer containing silicon oxide and having a density of 2.4 g/cm$^3$ or less on at least one of a piezoelectric substrate or a support substrate; forming a high-impedance layer having an amorphous region on the substrate having formed thereon the low-impedance layer; and joining the piezoelectric substrate and the support substrate to form a reflective layer including the low-impedance layer and the high-impedance layer between the piezoelectric substrate and the support substrate. The joining is performed by placing the piezoelectric substrate and the support substrate in a vacuum atmosphere.

Advantageous Effects of Invention

According to the embodiment of the present invention, the composite substrate excellent in durability can be obtained.

DESCRIPTION OF EMBODIMENTS

Figure 1:
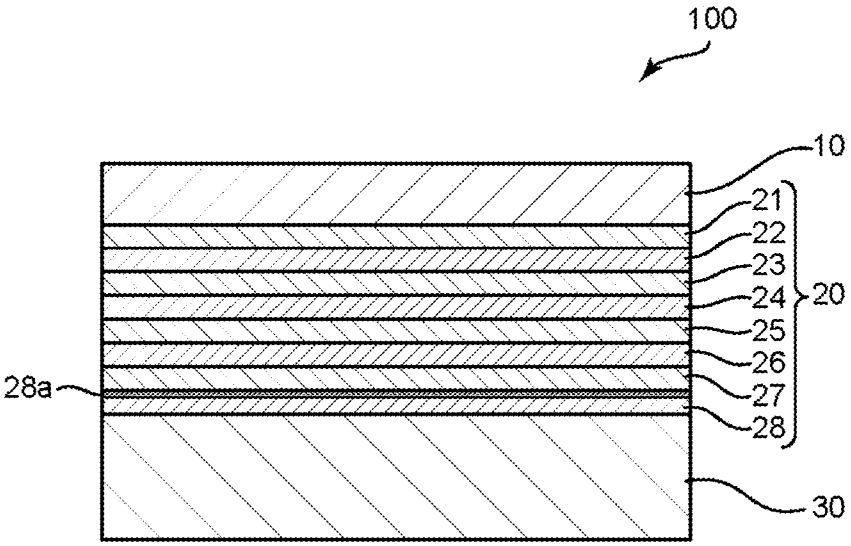
FIG. 1 is a schematic sectional view for illustrating the schematic configuration of a composite substrate according to one embodiment of the present invention.

Embodiments of the present invention are described below with reference to the drawings. However, the present invention is not limited to these embodiments. In addition, in the drawings, the width, thickness, shape, and the like of each portion may be schematically illustrated as compared to those in the embodiments in order to provide clearer description, but the drawings are merely examples and do not limit the interpretation of the present invention.

A. Composite Substrate

FIG. 1 is a schematic sectional view for illustrating the schematic configuration of a composite substrate according to one embodiment of the present invention. A composite substrate 100 includes a piezoelectric layer 10, a reflective layer 20, and a support substrate 30 in the stated order. The reflective layer 20 includes a high-impedance layer having a relatively high acoustic impedance and a low-impedance layer having a relatively low acoustic impedance. The reflective layer 20 is a laminate of a plurality of impedance layers, and for example, the high-impedance layer and the low-impedance layer are alternately laminated. In the illustrated example, the reflective layer 20 includes a low-impedance layer 21, a high-impedance layer 22, a low-impedance layer 23, a high-impedance layer 24, a low-impedance layer 25, a high-impedance layer 26, a low-impedance layer 27, and a high-impedance layer 28 in the stated order from the piezoelectric layer 10 side. In the illustrated example, out of the respective layers of the reflective layer 20, the low-impedance layer 21 is arranged on the side closest to the piezoelectric layer 10, and the high-impedance layer 28 is arranged on the side closest to the support substrate 30. The arrangement of the reflective layer 20 having such laminated structure can effectively confine the energy of an elastic wave to the piezoelectric layer 10 side.

In the illustrated example, the reflective layer 20 is a laminate of a total of 8 layers, that is, the 4 high-impedance layers and the 4 low-impedance layers. However, the number of the impedance layers in the reflective layer is not limited thereto. Specifically, the reflective layer only needs to include at least one high-impedance layer and at least one low-impedance layer, the layers being different from each other in acoustic impedance. The reflective layer preferably has a multilayer structure including 4 or more layers.

In at least one high-impedance layer included in the reflective layer 20, an amorphous region may be formed. In the illustrated example, an amorphous region 28*a* is formed in the high-impedance layer 28 arranged closest to the support substrate 30. When the high-impedance layer having the amorphous region formed therein is included, the composite substrate may have excellent joining strength. In addition, the high-impedance layer having the amorphous region formed therein may contribute to an improvement in reflective characteristic.

The composite substrate 100 may further include any appropriate layer (not shown). The kinds, functions, number, combination, arrangement, and the like of such layers may be appropriately set in accordance with purposes. For example, the composite substrate 100 may include a joining layer arranged between the piezoelectric layer 10 or the reflective layer 20 and the support substrate 30.

The composite substrate 100 may be produced in any appropriate shape. In one embodiment, the substrate may be produced in the form of a so-called wafer. The size of the composite substrate 100 may be appropriately set in accordance with purposes. For example, the diameter of the wafer is from 50 mm to 150 mm.

A-1. Piezoelectric Layer

Any appropriate piezoelectric material may be used as a material for forming the piezoelectric layer. A single crystal having the composition of $LiAO_3$ is preferably used as the piezoelectric material. Herein, A represents one or more kinds of elements selected from the group consisting of: niobium; and tantalum. Specifically, $LiAO_3$ may be lithium niobate ($LiNbO_3$), lithium tantalate ($LiTaO_3$), or a lithium niobate-lithium tantalate solid solution.

When the piezoelectric material is lithium tantalate, a layer whose normal direction is rotated about the X-axis of the piezoelectric material, which is the direction in which a surface acoustic wave propagates, from the Y-axis thereof to the Z-axis thereof by from 1230 to 133° (e.g., 128°) is preferably used as the piezoelectric layer from the viewpoint of reducing a propagation loss. When the piezoelectric material is lithium niobate, a layer whose normal direction is rotated about the X-axis of the piezoelectric material, which is the direction in which a surface acoustic wave propagates, from the Y-axis thereof to the Z-axis thereof by from 96° to 114° (e.g., 110°) is preferably used as the piezoelectric layer from the viewpoint of reducing a propagation loss.

The thickness of the piezoelectric layer is, for example, 0.2 μm or more and 30 μm or less, preferably 0.2 μm or more and 5 μm or less.

A-2. Reflective Layer

As described above, the reflective layer includes the high-impedance layer and the low-impedance layer different from each other in acoustic impedance. The acoustic impedance of the high-impedance layer is relatively higher than the acoustic impedance of the low-impedance layer. Specifically, the acoustic impedance of a material for forming the high-impedance layer is higher than the acoustic impedance of a material for forming the low-impedance layer.

The plurality of low-impedance layers that may be included in the reflective layer may be identical to each other in configuration (e.g., material, thickness, or density), or may be different from each other in configuration. Similarly, the plurality of high-impedance layers that may be included in the reflective layer may be identical to each other in configuration (e.g., material, thickness, or density), or may be different from each other in configuration. For example, the amorphous region may be formed in all of the high-impedance layers that may be included in the reflective layer, or the amorphous region may be selectively formed in a part of the high-impedance layers that may be included therein.

A typical example of the material for forming the low-impedance layer is silicon oxide. In one embodiment, the content of silicon oxide in the low-impedance layer is, for example, 97 wt % or more. The ratio (O/Si) of an oxygen atom in the low-impedance layer to a silicon atom therein is, for example, 1.80 or more and 2.05 or less. The composition of the low-impedance layer may be identified by Rutherford backscattering spectrometry (RBS). At the time of the spectrometry, a sample obtained by separately forming the low-impedance layer on any appropriate substrate under the same conditions may be used.

The thickness of the low-impedance layer is, for example, from 0.01 μm to 1 μm, preferably from 20 nm to 500 nm, more preferably from 100 nm to 300 nm. When the plurality of low-impedance layers are included in the reflective layer, the thickness of the low-impedance layer means the thickness of each of the low-impedance layers. The low-impedance layer typically has a region of a granular structure.

The density of the low-impedance layer is preferably 2.4 $g/cm^3$ or less, more preferably 2.35 $g/cm^3$ or less. When the low-impedance layer has such density, a difference in acoustic impedance between the low-impedance layer and the high-impedance layer can be increased more and the energy of an elastic wave can be more effectively confined to the piezoelectric layer side. Meanwhile, the low-impedance layer having such density easily contains moisture. Specifically, the low-impedance layer tends to take in moisture from the atmosphere during its formation. The density of the low-impedance layer is typically 2.1 g/cm$^3$ or more.

At least one low-impedance layer included in the reflective layer only needs to satisfy the above-mentioned density, but all of the low-impedance layers included in the reflective layer each preferably satisfy the above-mentioned density.

The density of the impedance layer may be determined by X-ray reflectivity (XRR).

Example of the material for forming the high-impedance layer include hafnium oxide, tantalum oxide, zirconium oxide, and aluminum oxide. Of those, hafnium oxide is preferably used. The use of hafnium oxide can more effectively confine the energy of an elastic wave to the piezoelectric layer side. In one embodiment, the content of hafnium oxide in the high-impedance layer is, for example, 97 wt % or more.

The thickness of the high-impedance layer is, for example, from 0.01 μm to 1 μm, preferably from 20 nm to 500 nm, more preferably from 100 nm to 300 nm. When the plurality of high-impedance layers are included in the reflective layer, the thickness of the high-impedance layer means the thickness of each of the high-impedance layers.

The thickness of the amorphous region that may be formed in the high-impedance layer is, for example, 5 nm or more, preferably 10 nm or more. Meanwhile, the thickness of the amorphous region is, for example, 70 nm or less. The amorphous region only needs to be formed at least partially in the high-impedance layer in plan view seen from the main surface side of the substrate. Specifically, a non-amorphous region may be formed between fragmented amorphous regions, or a non-amorphous region having a thickness smaller than that of any other site may be formed. The amorphous region is preferably formed over the entirety of the high-impedance layer in plan view seen from the main surface side of the substrate.

The presence or absence of the formation of the amorphous region may be determined from its average thickness. For example, when the average thickness of the amorphous region is 10 nm or more, it can be determined that the amorphous region is formed. A method of calculating the average thickness is described in detail later.

The position of the amorphous region in one high-impedance layer is not particularly limited, but the amorphous region is typically formed in an end portion of the high-impedance layer in a thickness direction. In the formation of the impedance layer described later, the high-impedance layer tends to be in an amorphous state at the initial stage of the formation of the high-impedance layer. For example, when a high-impedance layer is to be formed on a piezoelectric layer (i.e., a piezoelectric substrate described later), an amorphous region may be formed in an end portion of the high-impedance layer on a piezoelectric layer side.

In a region of the high-impedance layer excluding the amorphous region, for example, a columnar structure or a granular structure is formed. Herein, the columnar structure is formed of a structural body (columnar body) extending in a direction having an angle with respect to the substrate surface (in-plane direction) of the composite substrate, and its column diameter is, for example, 5 nm or more. The granular structure is formed of a substantially spherical structural body. Such structure may be recognized through observation with, for example, a transmission electron microscope (TEM). The above-mentioned column diameter does not need to be satisfied at all positions in the film thickness direction of the columnar body to be observed.

In one embodiment, a region of the columnar structure in one high-impedance layer accounts for, for example, 70% or more, preferably 80% or more, more preferably 90% or more of the high-impedance layer. It is assumed that moisture included in the low-impedance layer may move among the structural bodies for forming the high-impedance layer. The moisture easily moves among the columnar bodies, and a significant effect of the formation of the amorphous region may be presumably obtained.

The impedance layers may be formed by any appropriate method. The layers may be formed by, for example, physical vapor deposition, such as sputtering or ion beam-assisted deposition (IAD), chemical vapor deposition, or an atomic layer deposition (ALD) method.

A-3. Support Substrate

Any appropriate substrate may be used as the support substrate. The support substrate may include a single crystalline substance, or may include a polycrystalline substance. A material for forming the support substrate is preferably selected from the group consisting of: silicon; sialon; sapphire; cordierite; mullite; glass; quartz; crystal; and alumina.

The silicon may be single crystal silicon, polycrystalline silicon, or high resistance silicon.

Typically, the sialon is a ceramic obtained by sintering a mixture of silicon nitride and alumina, and has composition represented by, for example, $Si_{6-w}Al_wO_wN_{8-w}$. Specifically, the sialon has such composition that alumina is mixed into silicon nitride, and "w" in the formula represents the mixing ratio of alumina. "w" preferably represents 0.5 or more and 4.0 or less.

Typically, the sapphire is a single crystalline substance having the composition of $Al_2O_3$, and the alumina is a polycrystalline substance having the composition of $Al_2O_3$. The alumina is preferably translucent alumina.

Typically, the cordierite is a ceramic having the composition of $2MgO \cdot 2Al_2O_3$~$5SiO_2$, and the mullite is a ceramic having composition in the range of from $3Al_2O_3 \cdot 2SiO_2$ to $2Al_2O_3 \cdot SiO_2$.

The thermal expansion coefficient of the material for forming the support substrate is preferably smaller than the thermal expansion coefficient of the material for forming the piezoelectric layer. Such support substrate can suppress changes in shape and size of the piezoelectric layer at the time of a temperature change, and hence can suppress, for example, a change in frequency characteristic of a surface acoustic wave element to be obtained.

Any appropriate thickness may be adopted as the thickness of the support substrate. The thickness of the support substrate is, for example, from 100 μm to 1,000 μm.

A-4. Joining Layer

As described above, the composite substrate may include the joining layer. When the joining layer is arranged, the joining strength of the composite substrate can be improved. As a material for forming the joining layer, there are given, for example, a silicon oxide ($Si_{(1-x)}O_x$), silicon, tantalum oxide, niobium oxide, aluminum oxide, titanium oxide, and hafnium oxide. "x" in the $Si_{(1-x)}O_x$ preferably satisfies the relationship of $0.008 \le x \le 0.408$. The thickness of the joining layer is, for example, from 0.005 μm to 1 μm.

The joining layer may be formed by any appropriate method. Specifically, the layer may be formed by the same method as the above-mentioned method of forming the impedance layers.

In one embodiment, the composite substrate is free of the joining layer. For example, the reflective layer, and each of the support substrate and the piezoelectric layer are arranged adjacent to each other. In addition, for example, the reflective layer is free of the joining layer. Even in such form, when the high-impedance layer having formed therein the amorphous region is arranged, the composite substrate may have excellent joining strength. In addition, when the joining layer is absent, a step of forming the joining layer and a cost therefor can be eliminated.

A-5. Production Method

A method of producing a composite substrate according to one embodiment of the present invention includes: forming a low-impedance layer on at least one of a piezoelectric substrate or a support substrate; forming a high-impedance layer having an amorphous region on the substrate having formed thereon the low-impedance layer; and joining the piezoelectric substrate and the support substrate to form a reflective layer including the low-impedance layer and the high-impedance layer between the piezoelectric substrate and the support substrate.

Figure 2A:
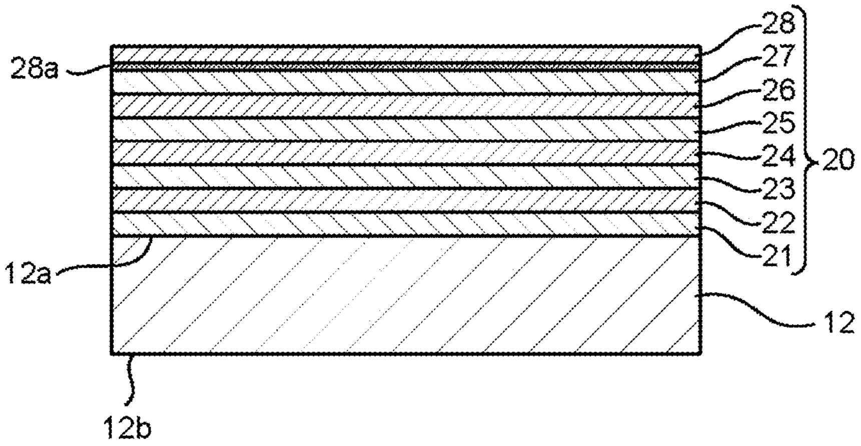
FIG. 2A is a view for illustrating an example of a production process for the composite substrate according to one embodiment.
Figure 2B:
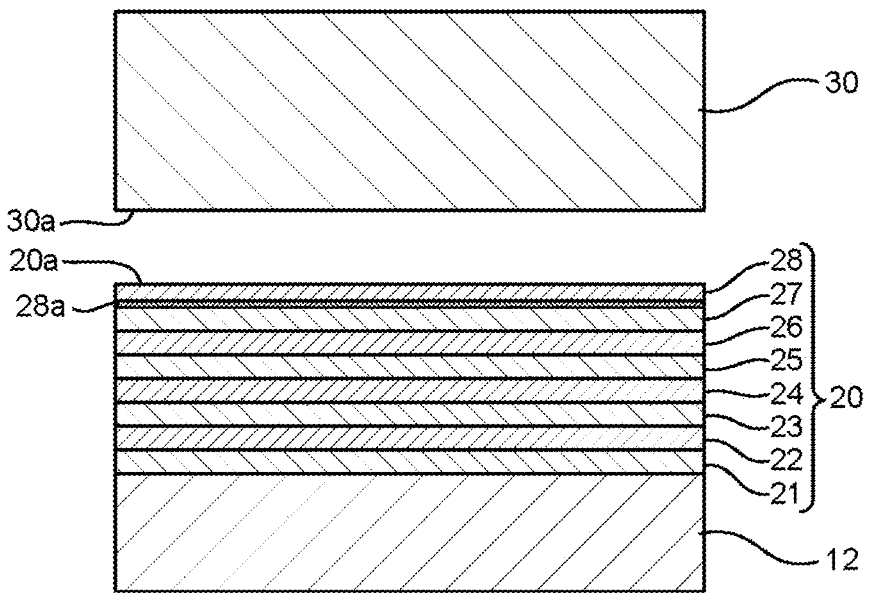
FIG. 2B is a view subsequent to FIG. 2A.
Figure 2C:
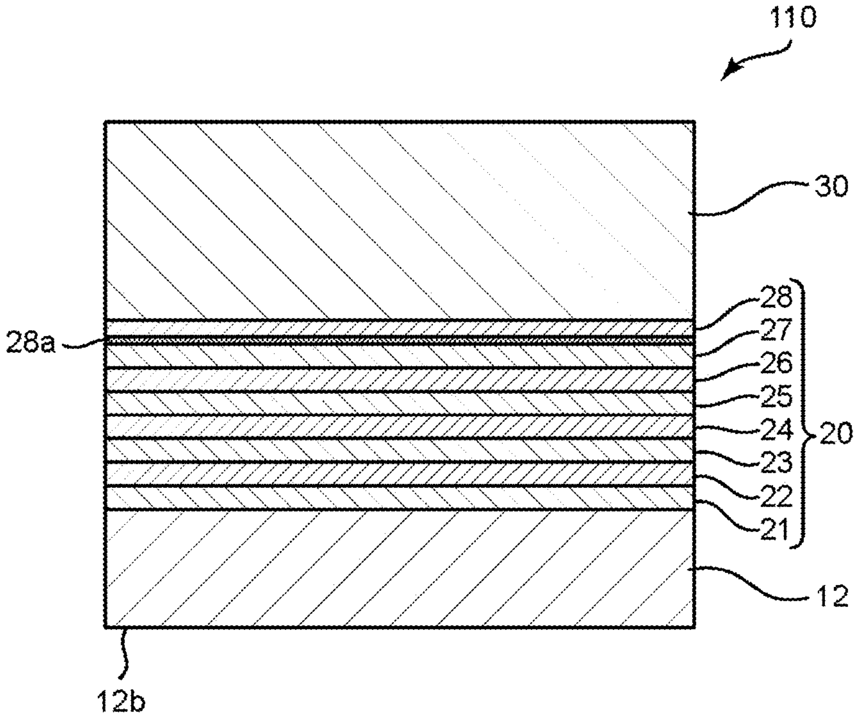
FIG. 2C is a view subsequent to FIG. 2B.

FIG. 2A to FIG. 2C are each a view for illustrating an example of a production process for the composite substrate according to one embodiment. FIG. 2A is an illustration of a state in which the low-impedance layers 21, 23, 25, and 27, and the high-impedance layers 22, 24, 26, and 28 are formed on a first main surface 12*a* of a piezoelectric substrate 12 having the first main surface 12*a* and a second main surface 12*b* facing each other, to thereby complete the reflective layer 20. The high-impedance layer 28 arranged farthest from the piezoelectric substrate 12 (preferably, on the outermost surface of the reflective layer 20) has formed therein an amorphous region 28*a*. The amorphous region 28*a* may be satisfactorily formed at the initial stage of the formation of the high-impedance layer 28, and is hence arranged in the end portion of the high-impedance layer 28 on the piezoelectric substrate 12 side in the illustrated example.

FIG. 2B is an illustration of a step of directly joining the piezoelectric substrate 12 having formed thereon the reflective layer 20, and the support substrate 30. At the time of the direct joining, the joining surfaces are preferably activated by any appropriate activation treatment. The direct joining is performed by, for example, activating a surface 20*a* of the reflective layer 20, activating a surface 30*a* of the support substrate 30, then bringing the activated surface of the reflective layer 20 and the activated surface of the support substrate 30 into contact with each other, and pressurizing the resultant. Thus, a composite substrate 110 illustrated in FIG. 2C is obtained. The second main surface 12*b* of the piezoelectric substrate 12 of the resultant composite substrate 110 is typically subjected to processing, such as grinding or polishing, so that a piezoelectric layer having the above-mentioned desired thickness may be obtained.

The activation treatment is typically performed by irradiating the joining surface with a neutralized beam. The activation treatment is preferably performed by generating the neutralized beam with an apparatus such as an apparatus described in JP 2014-086400 A, and irradiating the joining surface with the beam. Specifically, a saddle-field fast atomic beam source is used as a beam source, and an inert gas, such as argon or nitrogen, is introduced into the chamber of the apparatus, followed by the application of a high voltage from the DC power source thereof to an electrode thereof. Thus, a saddle-field electric field is generated between the electrode (positive electrode) and the casing (negative electrode) thereof to cause electron motion, to thereby generate the beams of an atom and an ion by the inert gas. Of the beams that have reached the grid of the fast atomic beam source, an ion beam is neutralized by the grid, and hence the beam of a neutral atom is emitted from the fast atomic beam source. The voltage at the time of the activation treatment by the beam irradiation is preferably set to from 0.5 kV to 2.0 kV, and a current at the time of the activation treatment by the beam irradiation is preferably set to from 50 mA to 200 mA.

The joining is preferably performed in a vacuum atmosphere from the viewpoint of obtaining sufficient joining strength. Specifically, in the activation treatment, the substrates to be joined are preferably placed in a vacuum atmosphere. A temperature at the time of the joining is typically normal temperature. Specifically, the temperature is preferably 20° C. or more and 40° C. or less, more preferably 25° C. or more and 30° C. or less. A pressure to be applied at the time of the joining is preferably from 100 N to 20,000 N.

The vacuum atmosphere refers to, for example, an atmosphere having a vacuum degree of $5\times10^{-6}$ Pa or less, preferably a vacuum degree of $3\times10^{-6}$ Pa or less. By forming the high-impedance layer having formed therein the amorphous region on the side of the substrate on which the low-impedance layer is formed (in the illustrated example, the piezoelectric substrate), a vacuuming step (vacuuming) for placing the two substrates to be joined in a vacuum atmosphere can be performed in a short period of time, and sufficient joining strength can be achieved. As described above, the low-impedance layer having a low density tends to take in moisture from the atmosphere during its formation and tends to contain moisture. When the substrate including such low-impedance layer formed thereon is subjected to the vacuuming step, moisture is released from the low-impedance layer, and it takes a lot of time to lower the vacuum degree of the atmosphere, which may lead to a decrease in productivity. By allowing the high-impedance layer having formed therein the amorphous region to be present on the substrate having such low-impedance layer formed thereon, a path for the moisture to pass through is blocked to suppress the release of the moisture (outgassing), and the vacuuming step can be performed in a short period of time, which may contribute to an improvement in productivity.

The surface of each layer (e.g., the piezoelectric substrate, the reflective layer, or the support substrate) is preferably a flat surface. Specifically, the surface roughness Ra of the surface of each layer is preferably 1 nm or less, more preferably 0.3 nm or less. A method of flattening the surface of each layer is, for example, mirror polishing, lap polishing, or chemical-mechanical polishing (CMP).

At the time of the film formation and the joining described above, the surface of each layer is preferably washed for, for example, removing the residue of a polishing agent, a work-affected layer, or the like. A method for the washing is, for example, wet washing, dry washing, or scrub washing. Of those, scrub washing is preferred because the surface can be simply and efficiently washed. A specific example of the scrub washing is a method including washing the surface in a scrub washing machine with a detergent (e.g., a SUNWASH series manufactured by Lion Corporation) and then with a solvent (e.g., a mixed solution of acetone and isopropyl alcohol (IPA)).

In the illustrated example, the impedance layers for forming the reflective layer are formed on the piezoelectric substrate side, but the impedance layers may be formed on the support substrate side, and the support substrate having formed thereon the reflective layer and the piezoelectric substrate may be joined to provide a composite substrate. In this case, the amorphous region is preferably formed in the high-impedance layer arranged farthest from the support substrate. In addition, unlike the illustrated example, a part of the impedance layers for forming the reflective layer may be formed on the piezoelectric substrate side, and a part of the impedance layers for forming the reflective layer may be formed on the support substrate side. Then, the piezoelectric substrate and the support substrate may be joined to provide a composite substrate. In this case, the amorphous region is preferably formed in the high-impedance layer arranged farthest from each of the piezoelectric substrate and the support substrate.

In the illustrated example, the joining layer is not formed from the viewpoint of a film formation cost. However, the joining layer may be formed at any appropriate position (timing), and then the piezoelectric substrate and the support substrate may be joined. By forming the joining layer on the side of a substrate on which the low-impedance layer is to be formed, the time of the vacuuming step can be further reduced.

B. Surface Acoustic Wave Element

A surface acoustic wave element according to one embodiment of the present invention includes the above-mentioned composite substrate. The surface acoustic wave element typically includes the composite substrate and an electrode (comb electrode) arranged on the piezoelectric layer side of the composite substrate. Such surface acoustic wave element is suitably used as, for example, a SAW filter in a communication device such as a cellular phone.

EXAMPLES

The present invention is specifically described below by way of Examples. However, the present invention is not limited by these Examples. The density of a silicon oxide layer is a value measured by a measurement method described below.

<Measurement of Density>

The density of the silicon oxide layer was determined by X-ray reflectivity (XRR).

Analysis was performed by using Automated Multipurpose X-ray Diffractometer ("SmartLab" manufactured by Rigaku Corporation) under the conditions of: an incident X-ray wavelength of 0.15418 nm (CuKα ray); an X-ray output of 45 kV, 200 mA; a measurement range (angle formed by an X-ray with respect to the surface of a sample) of from 0.0° to 4.0°; and a measurement step of 0.01°.

Example 1

A lithium tantalate (LT) substrate having an orientation flat (OF) portion, and having a diameter of 4 inches and a thickness of 250 μm (such a 128° Y-cut X-propagation LT substrate that the direction in which a surface acoustic wave (SAW) propagated was represented by X, the substrate being a rotated Y-cut plate having a cut-out angle of 128°) was prepared. The surface of the LT substrate was subjected to mirror polishing so as to have an arithmetic average roughness Ra of 0.3 nm. Herein, the arithmetic average roughness Ra is a value measured with an atomic force microscope (AFM) in a field of view measuring 10 μm by 10 μm.

A silicon oxide layer (thickness: 150 nm, density: 2.32 g/cm$^3$) was formed on the polished surface of the LT substrate. Specifically, the silicon oxide layer was formed with a single-wafer sputtering device (RF magnetron sputtering method) using a silicon oxide target having a diameter of 10 inches under the conditions of: a power supply of 2 kW; a T-S distance of 65 mm; and a flow rate ratio of oxygen and argon (oxygen flow rate/(oxygen flow rate+argon flow rate)) of 7%.

Then, a hafnium oxide layer (thickness: 150 nm) was formed on a surface of the silicon oxide layer. Specifically, the hafnium oxide layer was formed with the single-wafer sputtering device (RF magnetron sputtering method) using a hafnium oxide target having a diameter of 10 inches under the conditions of: a power supply of 2 kW; a T-S distance of 65 mm; and a flow rate ratio of oxygen and argon (oxygen flow rate/(oxygen flow rate+argon flow rate)) of 3% so that an amorphous region was formed at the initial stage of the formation of the hafnium oxide layer.

Thus, a sample for evaluation was obtained.

Example 2

A silicon oxide layer (thickness: 150 nm, density: 2.32 g/cm$^3$) and a hafnium oxide layer (thickness: 150 nm) were formed on the polished surface of the LT substrate in the stated order. Specifically, the silicon oxide layer and the hafnium oxide layer were formed with the single-wafer sputtering device (RF magnetron sputtering method) using a silicon oxide target and a hafnium oxide target each having a diameter of 10 inches under the conditions of: a power supply of 2 kW; a T-S distance of 65 mm; and a flow rate ratio of oxygen and argon (oxygen flow rate/(oxygen flow rate+argon flow rate)) of 7%. Subsequently, the film formation was repeated twice.

Next, a silicon oxide layer (thickness: 150 nm, density: 2.32 g/cm$^3$) was formed on a surface of the third hafnium oxide layer from the LT substrate side under the same conditions as described above, and then a hafnium oxide layer (thickness: 150 nm) was formed on a surface of the silicon oxide layer under the same conditions as in Example 1 (so that an amorphous region was formed at the initial stage of the formation of the hafnium oxide layer). Thus, a sample for evaluation was obtained.

Example 3

A silicon oxide layer (thickness: 150 nm, density: 2.32 g/cm$^3$) and a hafnium oxide layer (thickness: 150 nm) were formed on the polished surface of the LT substrate in the stated order. Specifically, the silicon oxide layer and the hafnium oxide layer were formed with the single-wafer sputtering device (RF magnetron sputtering method) using a silicon oxide target and a hafnium oxide target each having a diameter of 10 inches under the conditions of: a power supply of 2 kW; a T-S distance of 65 mm; and a flow rate ratio of oxygen and argon (oxygen flow rate/(oxygen flow rate+argon flow rate)) of 7%. Subsequently, the film formation was repeated once more.

Next, a silicon oxide layer (thickness: 150 nm, density: 2.32 g/cm$^3$) was formed on a surface of the second hafnium oxide layer from the LT substrate side under the same conditions as described above, and then a hafnium oxide layer (thickness: 150 nm) was formed on a surface of the silicon oxide layer under the same conditions as in Example 1 (so that an amorphous region was formed at the initial stage of the formation of the hafnium oxide layer).

Next, a silicon oxide layer (thickness: 150 nm, density: 2.32 g/cm$^3$) was formed on a surface of the third hafnium oxide layer from the LT substrate side under the same conditions as described above. Thus, a sample for evaluation was obtained.

Comparative Example 1

A silicon oxide layer (thickness: 150 nm, density: 2.32 g/cm$^3$) and a hafnium oxide layer (thickness: 150 nm) were formed on the polished surface of the LT substrate in the stated order. Specifically, the silicon oxide layer and the hafnium oxide layer were formed with the single-wafer sputtering device (RF magnetron sputtering method) using a silicon oxide target and a hafnium oxide target each having a diameter of 10 inches under the conditions of: a power supply of 2 kW; a T-S distance of 65 mm; and a flow rate ratio of oxygen and argon (oxygen flow rate/(oxygen flow rate+argon flow rate)) of 7%.

Thus, a sample for evaluation was obtained.

Comparative Example 2

A silicon oxide layer (thickness: 150 nm, density: 2.32 g/cm$^3$) and a hafnium oxide layer (thickness: 150 nm) were formed on the polished surface of the LT substrate in the stated order. Specifically, the silicon oxide layer and the hafnium oxide layer were formed with the single-wafer sputtering device (RF magnetron sputtering method) using a silicon oxide target and a hafnium oxide target each having a diameter of 10 inches under the conditions of: a power supply of 2 kW; a T-S distance of 65 mm; and a flow rate ratio of oxygen and argon (oxygen flow rate/(oxygen flow rate+argon flow rate)) of 7%. Subsequently, the film formation was repeated three times. Thus, a sample for evaluation was obtained.

Evaluation

The resultant samples for evaluation were each subjected to the following evaluations. The evaluation results are summarized in Table 1.

1. Determination of Presence or Absence of Formation of Amorphous Region

The presence or absence of formation of an amorphous region in the hafnium oxide layer arranged farthest from the LT substrate was determined by an automated crystal orientation mapping-TEM (ACOM-TEM) method. Specifically, sectional observation was performed with a Schottky field emission transmission electron microscope ("JEM-2100F" manufactured by JEOL Ltd.) under the conditions of: an acceleration voltage of 200 kV; a spot size of 1.0 nm; and a camera length of 50 cm. The electron microscope was controlled with "ASTAR2 (Topspin)" manufactured by NanoMEGAS SPRL under the conditions of: a precession angle of 0.5°; a measurement magnification of 40,000 times; and an interval of 2 nm/step, and data was collected. A sample for the sectional observation was prepared by a FIB method. In order to determine the assignment of a crystal structure more accurately, a depth dimension of the sample was set to from 40 nm to 50 nm.

From the obtained data, a map of a crystal layer was created by using "OIM Analysis" manufactured by EDAX Inc. From the created crystal layer map, a ratio P (%) of the crystal layer forming the hafnium oxide layer was calculated, and an average thickness $d_A$(nm) of the amorphous region was calculated from a total thickness "d" (nm) of the hafnium oxide layer and the ratio P by using the following formula. When the average thickness was 10 nm or more, it was determined that the amorphous region was present, and when the average thickness was less than 10 nm, it was determined that the amorphous region was absent.

$$d_A(\text{nm}) = d\,(\text{nm}) \times P\,(\%)$$

Figure 3A:
FIG. 3A is a sectional observation photograph of a hafnium oxide layer of Example 1.
Figure 3B:
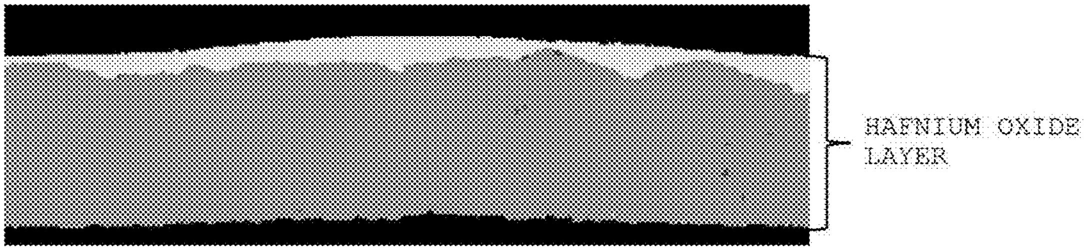
FIG. 3B is a crystal layer map of the sectional observation photograph shown in FIG. 3A.

As an example, a sectional observation photograph of Example 1 is shown in FIG. 3A, and a crystal layer map thereof is shown in FIG. 3B. From FIG. 3A, it can be recognized that an amorphous region is formed in an upper end portion of the hafnium oxide layer in a thickness direction, and a columnar structure (polycrystalline) is formed in other regions of the hafnium oxide layer. In the crystal layer map shown in FIG. 3B, the ratio of the amorphous region formed in the upper end portion of the hafnium oxide layer was 7.5%, and the average thickness of the amorphous region was obtained as 150×0.075=11.25 nm from the ratio and the total thickness of the hafnium oxide layer of 150 nm.

2. Time to Reach Vacuum

The surface of the resultant sample for evaluation was washed, and the sample was then placed in a vacuum chamber of a joining device to be used for production of a composite substrate. A time to reach a vacuum degree of $5\times10^{-6}$ Pa (time required for vacuuming) was measured.

TABLE 1

| | Silicon oxide layer | | Hafnium oxide layer Presence or absence of | Time to reach |
|---|---|---|---|---|
| | Density (g/cm$^3$) | Number of layers | amorphous region | vacuum (min) |
| Example 1 | 2.32 | 1 | Present | 5 |
| Example 2 | 2.32 | 4 | Present | 6 |
| Example 3 | 2.32 | 4 | Present | 37 |
| Comparative Example 1 | 2.32 | 1 | Absent | 35 |
| Comparative Example 2 | 2.32 | 4 | Absent | 50 |

Example 1 required less time for reaching a vacuum as compared to Comparative Example 1, and Examples 2 and 3 each required less time for reaching a vacuum as compared to Comparative Example 2.

INDUSTRIAL APPLICABILITY

The composite substrate according to one embodiment of the present invention may be suitably used in a surface acoustic wave element.

What is claimed is:

1. A composite substrate, comprising in this order:

a piezoelectric layer;

a reflective layer including a low-impedance layer containing silicon oxide and a high-impedance layer; and a support substrate, wherein the low-impedance layer has a density of 2.4 g/cm$^3$ or less, wherein the high-impedance layer has formed therein an amorphous region, and wherein the amorphous region is formed in an end portion of the high-impedance layer in a thickness direction.

2. The composite substrate according to claim 1, wherein the amorphous region is formed on a piezoelectric layer side of the high-impedance layer.

3. The composite substrate according to claim 1, wherein the reflective layer includes a plurality of high-impedance layers, and wherein the amorphous region is formed in at least the high-impedance layer arranged closest to the support substrate.

4. The composite substrate according to claim 1, wherein the high-impedance layer and the low-impedance layer are alternately laminated in the reflective layer.

5. The composite substrate according to claim 1, wherein the reflective layer and the support substrate are arranged adjacent to each other.

6. The composite substrate according to claim 1, wherein the high-impedance layer contains at least one selected from the group consisting of: hafnium oxide; tantalum oxide; zirconium oxide; and aluminum oxide.

7. The composite substrate according to claim 1, wherein the high-impedance layer and the low-impedance layer each have a thickness of from 0.01 μm to 1 μm.

8. The composite substrate according to claim 1, wherein the amorphous region has an average thickness of 10 nm or more.

9. A surface acoustic wave element, comprising the composite substrate of claim 1.

10. A method of producing a composite substrate, comprising:

forming a low-impedance layer containing silicon oxide and having a density of 2.4 g/cm$^3$ or less on at least one of a piezoelectric substrate or a support substrate;

forming a high-impedance layer having an amorphous region on the substrate having formed thereon the low-impedance layer; and joining the piezoelectric substrate and the support substrate to form a reflective layer including the low-impedance layer and the high-impedance layer between the piezoelectric substrate and the support substrate, wherein the joining is performed by placing the piezoelectric substrate and the support substrate in a vacuum atmosphere; and wherein the amorphous region is formed in an end portion of the high-impedance layer in a thickness direction.

* * * * *